United States Patent
Wang et al.

(10) Patent No.: US 12,538,688 B2
(45) Date of Patent: Jan. 27, 2026

(54) DISPLAY MODULE AND METHOD FOR MANUFACTURING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yang Wang, Beijing (CN); Haijun Yin, Beijing (CN); Qifu Ran, Beijing (CN); Mingfang Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 1164 days.

(21) Appl. No.: 17/480,181

(22) Filed: Sep. 21, 2021

(65) Prior Publication Data

US 2022/0102687 A1    Mar. 31, 2022

(30) Foreign Application Priority Data

Sep. 30, 2020 (CN) .......................... 202011063781.0

(51) Int. Cl.
*H10K 59/38* (2023.01)
*G02B 5/30* (2006.01)
*H10K 59/12* (2023.01)
*H10K 59/65* (2023.01)
*H10K 59/80* (2023.01)

(52) U.S. Cl.
CPC ........... *H10K 59/38* (2023.02); *G02B 5/3016* (2013.01); *H10K 59/1201* (2023.02); *H10K 59/65* (2023.02); *H10K 59/8792* (2023.02)

(58) Field of Classification Search
CPC .... H10K 59/38; H10K 59/8792; H10K 50/86; H10K 50/865
See application file for complete search history.

(56) References Cited

U.S. PATENT DOCUMENTS

2015/0337203 A1* 11/2015 Hida .................. C09K 19/2007
                                                    252/299.1
2022/0045132 A1*  2/2022 Lee ......................... G02B 5/201

* cited by examiner

*Primary Examiner* — Antonio B Crite
(74) *Attorney, Agent, or Firm* — Dority & Manning, P.A.

(57) ABSTRACT

A display module has a display area. The display area includes a main display area and a sub display area. The display module includes: a display panel, a first color filter layer disposed at a light exit side of the display panel and located in the main display area, and a polarizing layer disposed at the light exit side of the display panel and located in the sub display area. The polarizing layer serves to change a polarization direction of at least part of external light entering an inside of the display panel, so as to prevent the at least part of the external light entering the inside of the display panel from exiting from the light exit side of the display panel.

20 Claims, 11 Drawing Sheets

| A display panel is provided. The display panel has a display area, and the display area includes a main display area and a sub display area | — S100 |

↓

| A first color filter layer is formed at a light exit side of the display panel. The first color filter layer is located in the main display area, and the first color filter layer includes a plurality of first color filter portions | — S200 |

↓

| A polarizing layer is formed at the light exit side of the display panel. The polarizing layer is located in the sub display area, and the polarizing layer is configured to change a polarization direction of at least part of external light entering an inside of the display panel, so as to prevent the at least part of the external light entering the inside of the display panel from exiting from the light exit side of the display panel | — S300 |

FIG. 14

| A polarizing structure to be processed is provided | — S310 |

↓

| A portion of the polarizing structure to be processed located in the main display area is faded to obtain the partially faded polarizing structure. A portion of the partially faded polarizing structure located in the main display area forms the light-transmitting sheet and a portion of the partially faded polarizing structure located in the sub display area forms the polarizer | — S320 |

DISPLAY MODULE AND METHOD FOR MANUFACTURING THE SAME, AND DISPLAY APPARATUS

CROSS-REFERENCE TO RELATED APPLICATION

This application claims priority to Chinese Patent Application No. 202011063781.0, filed on Sep. 30, 2020, which is incorporated herein by reference in its entirety.

TECHNICAL FIELD

The present disclosure relates to the field of display technologies, and in particular, to a display module and a method for manufacturing the same, and a display apparatus.

BACKGROUND

With the continuous development of science and technology, users are pursuing a higher screen-to-body ratio of a display apparatus (i.e., a ratio of an area of a display screen to an area of a front panel of the display apparatus). Based on this, a concept of a full screen has emerged. That is, an optical device such as an image collector in the display apparatus is disposed under the display screen, so as to increase the ratio between the area of the display screen and the area of the front panel of the display apparatus, and to make the ratio approach 100%.

SUMMARY

In an aspect, a display module is provided. The display module has a display area. The display area includes a main display area and a sub display area. The display module includes a display panel, a first color filter layer disposed at a light exit side of the display panel and located in the main display area, and a polarizing layer disposed at the light exit side of the display panel and located in the sub display area. The first color filter layer includes a plurality of first color filter portions. The polarizing layer is configured to change a polarization direction of at least part of external light entering an inside of the display panel, so as to prevent the at least part of the external light entering the inside of the display panel from exiting from the light exit side of the display panel.

In some embodiments, the display module further includes a light-transmitting sheet disposed at the light exit side of the display panel and located in the main display area. The polarizing layer is a polarizer, and the polarizer and the light-transmitting sheet are integrated with each other to form a partially faded polarizing structure.

In some embodiments, the light-transmitting sheet is disposed at a side of the first color filter layer away from the display panel.

In some embodiments, the polarizing layer is a polarizing film, and the polarizing film is made of at least one of an azo polymer material or a lyotropic liquid crystal material.

In some embodiments, the display module further includes a black matrix disposed between the display panel and the first color filter layer and located in the main display area. The black matrix has a plurality of first openings, and at least part of each first color filter portion is located in a respective one of the plurality of first openings.

In some embodiments, the display module further includes a second color filter layer disposed at the light exit side of the display panel and located in the sub display area. The second color filter layer includes a plurality of second color filter portions.

In some embodiments, the display module further includes a light-transmitting layer disposed between the display panel and the second color filter layer and located in the sub display area. The light-transmitting layer has a plurality of second openings, and at least part of each second color filter portion is located in a respective one of the plurality of second openings.

In some embodiments, the light-transmitting layer is made of a transparent organic material.

In some embodiments, the polarizing layer is disposed at a side of the second color filter layer away from the display panel.

In some embodiments, the polarizing layer is disposed at a side of the second color filter layer proximate to the display panel.

In some embodiments, the plurality of first color filter portions are of different colors and the plurality of second color filter portions are of different colors. First color filter portions and second color filter portions that are of a same color are made of a same material and disposed in a same layer.

In some embodiments, the plurality of first color filter portions are of different colors and the plurality of second color filter portions are of different colors. The display panel has a plurality of sub-pixels. Each sub-pixel located in the main display area corresponds to a respective first color filter portion of a same color as the sub-pixel, and each sub-pixel located in the sub display area corresponds to a respective second color filter portion of a same color as the sub-pixel.

In some embodiments, a distribution density of sub-pixels located in the main display area is greater than a distribution density of sub-pixels located in the sub display area.

In some embodiments, the display module further has a peripheral area located outside the display area. Each sub-pixel includes: a light-emitting device, and a pixel driving circuit electrically connected to the light-emitting device. A pixel driving circuit electrically connected to a light-emitting device located in the main display area is located in the main display area. A pixel driving circuit electrically connected to a light-emitting device located in the sub display area is located in the main display area or the peripheral area.

In some embodiments, in a case where the display module is in a dark state or an off-screen state, reflectivity of a portion of the display module located in the main display area is approximately the same as reflectivity of a portion of the display module located in the sub display area.

In some embodiments, in the case where the display module is in the dark state or the off-screen state, the reflectivity of the portion of the display module located in the main display area is within a range of about 5.5% to about 6%.

In some embodiments, the display module further includes a planarization layer disposed at the light exit side of the display panel. The first color filter layer is disposed at a side of the planarization layer proximate to the display panel, and the polarizing layer is disposed at a side of the planarization layer away from the display panel.

In another aspect, a method for manufacturing a display module is provided. The method includes: providing a display panel, the display panel having a display area, the display area including a main display area and a sub display area; forming a first color filter layer at a light exit side of the display panel, the first color filter layer being located in the main display area, and the first color filter layer including a plurality of first color filter portions; and forming a polarizing layer at the light exit side of the display panel, the polarizing layer being located in the sub display area, and the polarizing layer being configured to change a polarization direction of at least part of external light entering an inside of the display panel, so as to prevent the at least part of the external light entering the inside of the display panel from exiting from the light exit side of the display panel.

In some embodiments, the polarizing layer is a polarizer. The method further includes: forming a light-transmitting sheet at the light exit side of the display panel in a process in which the polarizing layer is formed. The light-transmitting sheet is located in the main display area, and the light-transmitting sheet and the polarizer are integrated with each other to form a partially faded polarizing structure. Forming the partially faded polarizing structure includes: providing a polarizing structure to be processed; and fading a portion of the polarizing structure to be processed located in the main display area to obtain the partially faded polarizing structure. A portion of the partially faded polarizing structure located in the main display area forms the light-transmitting sheet, and a portion of the partially faded polarizing structure located in the sub display area forms the polarizer.

In yet another aspect, a display apparatus is provided. The display apparatus includes: the display module according to any one of the above embodiments; and an optical device disposed at a side of the display panel in the display module away from the polarizing layer and located in the sub display area of the display module.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings in the following description can be regarded as schematic diagrams, but are not limitations on actual sizes of products, and actual processes of methods to which the embodiments of the present disclosure relate.

FIG. 14 is a flow diagram of a method for manufacturing a display module, in accordance with some embodiments of the present disclosure;

FIG. 15 is a flow diagram of a method for manufacturing another display module, in accordance with some embodiments of the present disclosure;

DETAILED DESCRIPTION

Figure 1:
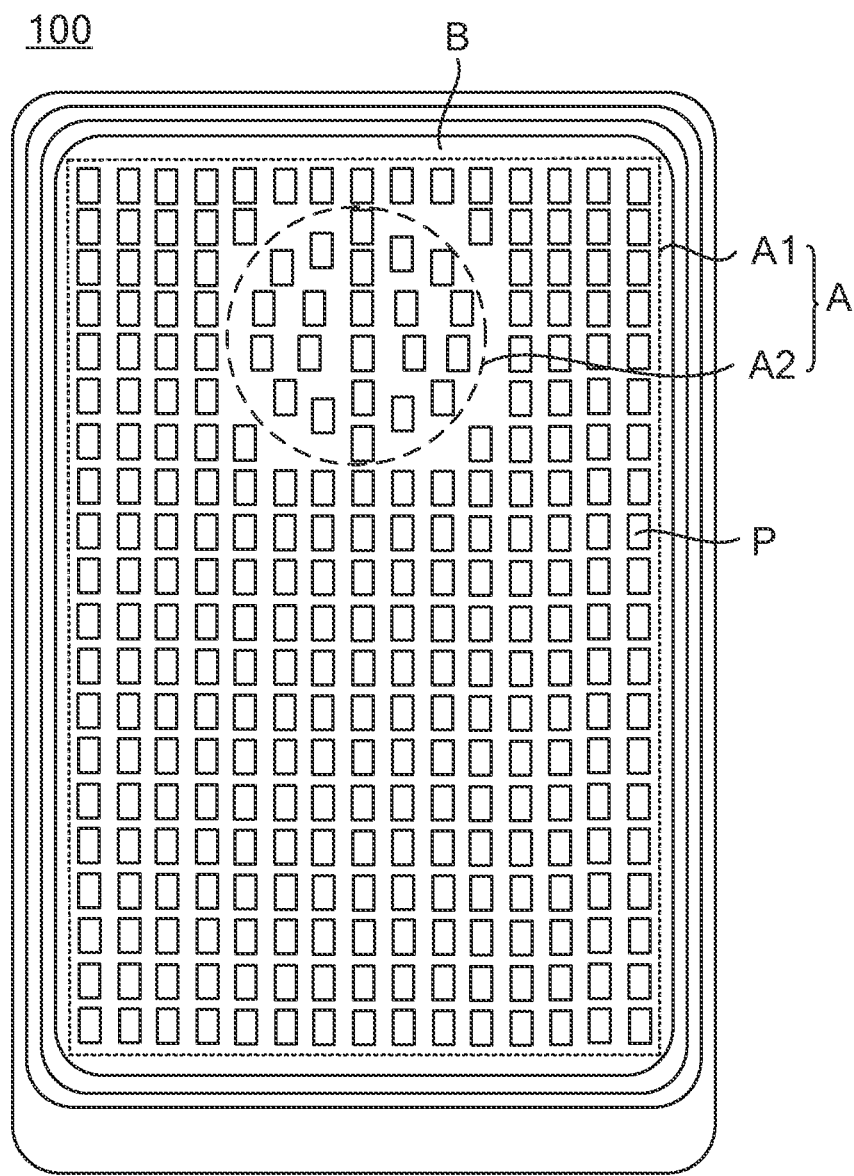
FIG. 1 is a structural diagram of a display module, in accordance with some embodiments of the present disclosure.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as open and inclusive, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials, or characteristics may be included in any one or more embodiments or examples in any suitable manner.

Hereinafter, terms such as "first" and "second" are used for descriptive purposes only, and are not to be construed as indicating or implying the relative importance or implicitly indicating the number of indicated technical features below. Thus, features defined as "first" or "second" may explicitly or implicitly include one or more of the features. In the description of the embodiments of the present disclosure, the term "a plurality of/the plurality of" means two or more unless otherwise specified.

In the description of some embodiments, the term "connected" and its extension may be used. For example, the term "connected" may be used in the description of some embodiments to indicate that two or more components are in direct physical contact or electrical contact with each other. The embodiments disclosed herein are not necessarily limited to the contents herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "configured to" means an open and inclusive expression, which does not exclude devices configured to perform additional tasks or steps.

The term "about" or "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Terms such as "parallel", "perpendicular", or "equal" as used herein includes a stated condition and a condition similar to the stated condition. A range of the similar condition is within an acceptable deviation range, and the acceptable deviation range is determined by a person of ordinary skill in the art in view of measurement in question and the error associated with the measurement of a particular quantity (i.e., the limitations of a measurement system). For example, the term "parallel" includes absolute parallel and approximate parallel, and the acceptable deviation range for the approximate parallel may be, for example, a deviation within 5°. The term "perpendicular" includes absolute vertical and approximate vertical, and the acceptable deviation range of the approximate vertical may also be, for example, a deviation within 5°. The term "equal" includes absolute equality and approximate equality, and the acceptable deviation range of the approximate equality may be that, for example, a difference between the two that are equal is less than or equal to 5% of either of the two.

Exemplary embodiments are described herein with reference to sectional views and/or plan views as idealized exemplary drawings. In the accompanying drawings, thicknesses of layers and regions are enlarged for clarity. Therefore, variations in shape with respect to the drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Therefore, the regions shown in the accompanying drawings are schematic in nature, and their shapes are not intended to show actual shapes of the region in a device, and are not intended to limit the scope of the exemplary embodiments.

Display apparatuses generally include liquid crystal displays (LCD) apparatuses, organic light emitting diode (OLED) display apparatuses, and quantum dot light emitting diode (QLED) display apparatuses. Due to the structure and display principle of the LCD apparatus, it is difficult for external light to pass through a backlight module of the LCD apparatus. Therefore, it is difficult to provide an optical device such as an image collector under a display screen of the LCD apparatus. In comparison, due to that there is no need to provide a backlight module in the OLED display apparatus or a QLED display apparatus, an external light can pass through a gap between two adjacent sub-pixels in a display screen of the OLED display apparatus (or the QLED display apparatus), and can be incident on a non-light exit side of the OLED display apparatus (or the QLED display apparatus) from a light exit side thereof. Therefore, a full-screen design where an optical device such as an image collector in the display apparatus is disposed under the display screen is mainly applied to the OLED display apparatus (or the QLED display apparatus).

Considering the OLED display apparatus as an example, in a case where the external light enters the inside of the OLED display apparatus from a light exit side of the OLED display apparatus, structures in the OLED display apparatus (e.g., anode layers of OLEDs, metal wires, etc.) are easy to reflect the external light, thereby having an adverse effecting on a display effect of the OLED display apparatus. Therefore, the OLED display apparatus usually includes a circular polarizer disposed at the light exit side, so as to reduce a reflection of the external light, thereby improving the display effect.

In one implementation, the circular polarizer in the OLED display apparatus may be replaced with a black matrix disposed at the light exit side of the OLED display apparatus and a color film layer disposed at a side of the black matrix. In this way, while using the black matrix and the color film layer to reduce the reflection of the external light, a light transmittance of the OLED display apparatus may be improved, and a power consumption of the OLED display apparatus may be reduced, and a low power consumption requirement of users may be met.

However, since the black matrix blocks the gap between two adjacent sub-pixels in the OLED display apparatus, it is difficult for the external light to be incident on the non-light exit side of the OLED display apparatus from the light exit side of the OLED display apparatus, which makes it difficult for the image collector to operate normally.

In another implementation, a portion of the black matrix facing the image collector may be removed, so that the external light can enter the image collector. However, such arrangement will cause the reflectivity of a portion of the OLED display apparatus facing the image collector to be different from the reflectivity of other portions, thereby affecting an overall display effect of the OLED display apparatus.

Figure 16:
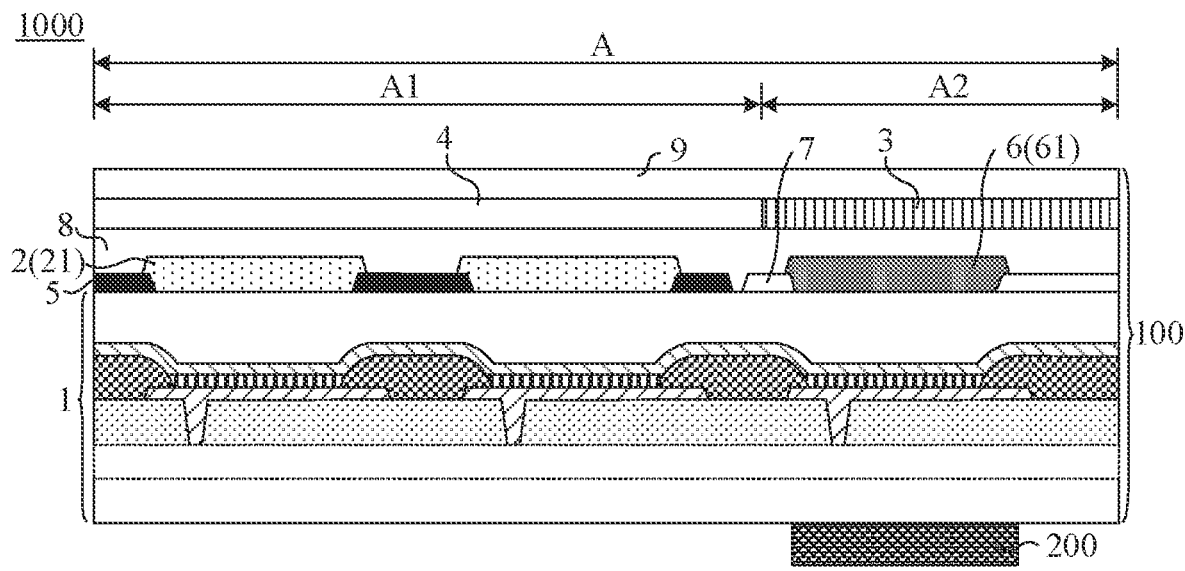
FIG. 16 is a structural diagram of a display apparatus, in accordance with some embodiments of the present disclosure.
Figure 17:
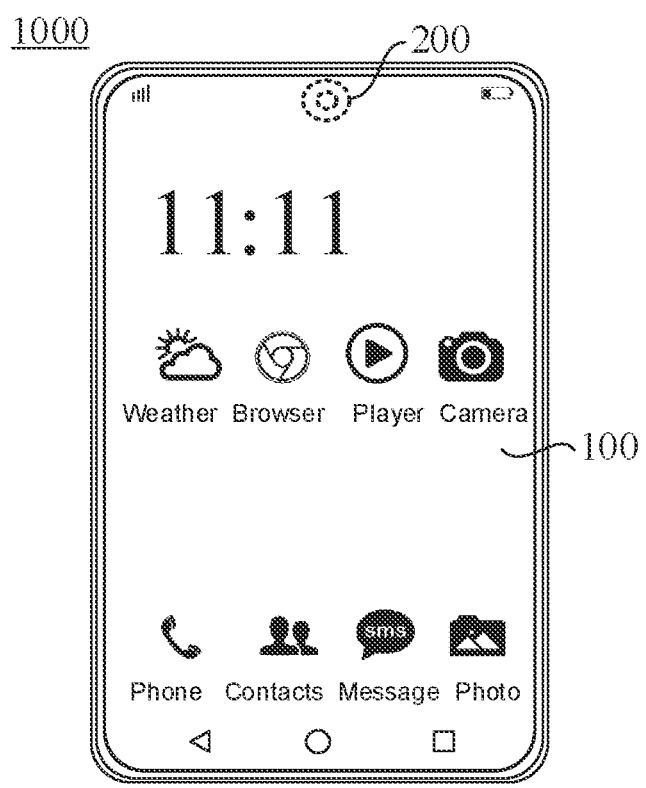
FIG. 17 is a structural diagram of another display apparatus, in accordance with some embodiments of the present disclosure.

On this basis, in some embodiments of the present disclosure, a display apparatus 1000 is provided. As shown in FIGS. 16 and 17, the display apparatus 1000 includes a display module 100 and an optical device 200.

Figure 2:
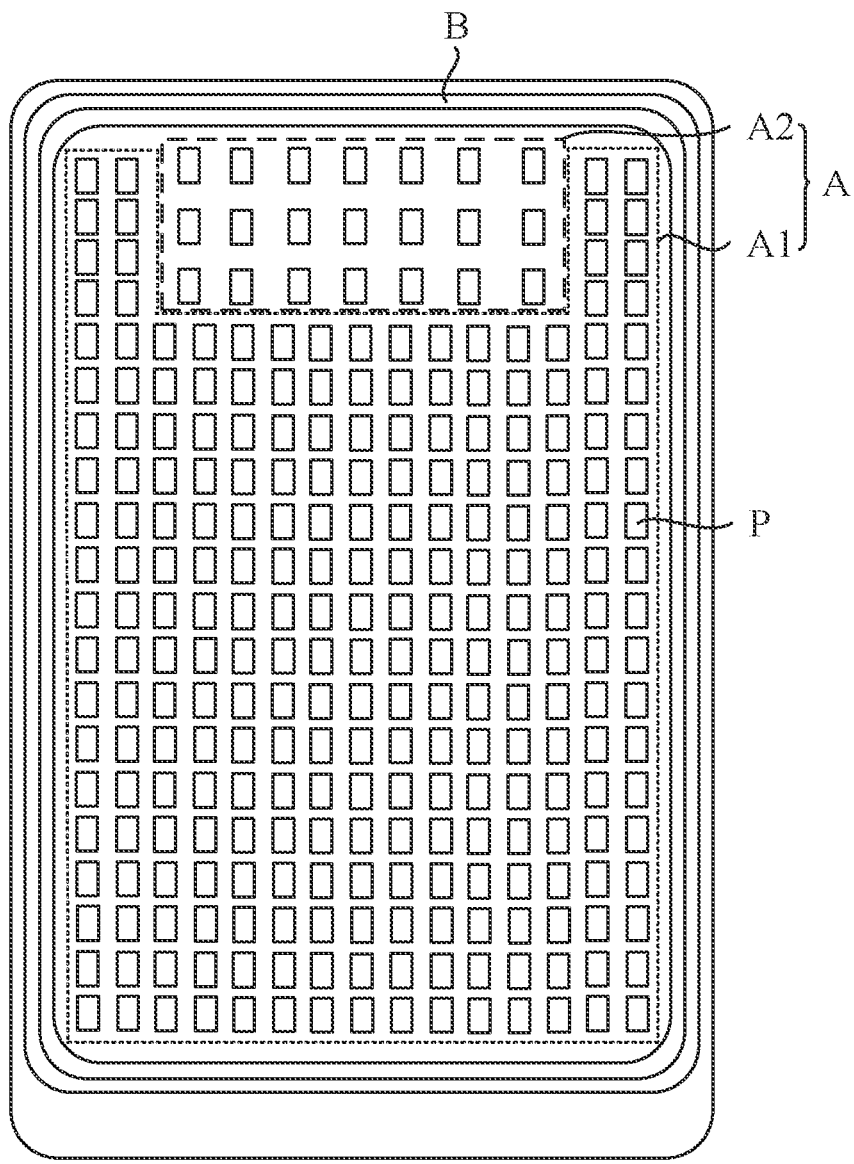
FIG. 2 is a structural diagram of another display module, in accordance with some embodiments of the present disclosure.

In some examples, as shown in FIGS. 1 and 2, the display module 100 has a display area A. The display area A includes a main display area A1 and a sub display area A2. An area of the main display area A1 may be, for example, greater than an area of the sub display area A2.

It will be noted that, there may be one or more sub display areas A2, and details may be selected and set according to actual needs. A positional relationship between the main display area A1 and the sub display area(s) A2 is of a variety of types, which may be selected and set according to actual needs.

In some examples, as shown in FIGS. 1 and 2, the display module 100 further has a peripheral area B.

It will be noted that an arrangement position of the peripheral area B is not limited in the embodiments of the present disclosure. For example, the peripheral area B may be located at one side, two sides, or three sides of the display area A. For another example, the peripheral area B may also be arranged around the display area A.

Hereinafter, a structure of the display apparatus 1000 is schematically described by considering an example in which there is one sub display area A2.

For example, as shown in FIG. 1, the main display area A1 is arranged around the sub display area A2. In this case, a shape of the sub display area A2 may be, for example, a circle as shown in FIG. 1, an ellipse, or a rectangle.

For example, as shown in FIG. 2, the sub display area A2 is located at a side of the main display area A1, that is, part of a border of the sub display area A2 overlaps with part of a border of the main display area A1. In this case, the shape of the sub display area A2 may be, for example, a rectangle as shown in FIG. 2, a rectangle with rounded corners, a drop shape, or a semicircle.

In some examples, the optical device 200 may include a photosensitive device. For example, the photosensitive device may include an image collector or an infrared receiver. The image collector may be, for example, a camera.

In some examples, as shown in FIG. 16, the optical device 200 is disposed in the sub display area A2 and is located at a non-light exit side of the display module 100. The external light can pass through the display module 100 and enter the optical device 200, so that the optical device 200 can operate.

It will be noted that, there may be one or more optical devices 200, the number of which may be selected and set according to actual needs. Moreover, in a case where there are a plurality of optical devices 200, there are a plurality of sub display areas A2 accordingly, and each optical device 200 is disposed in a respective sub display area A2. Or, in the case where there are the plurality of optical devices 200, there is one sub display area A2, and all the optical devices 200 are disposed in the sub display area A2. The number of the optical devices 200 and a corresponding relationship between the optical devices 200 and the sub display area A2 are not limited in the embodiments of the present disclosure, and the number of the optical devices 200 and the corresponding relationship may be selected according to specific requirements, for example, a layout requirement of the plurality of optical devices 200.

For example, in a case where the optical device 200 is not operating, the whole display area A can display an image.

For another example, in a case where the optical device 200 (e.g., the image collector) operates (e.g., when a user takes a selfie), the sub display area A2 may display a black image, and the main display area A1 may display a selfie image of the user; in this case, a position of the image collector can be clearly displayed; or, the entire display area A may display the selfie image of the user, and in this case, the position of the image collector is not displayed.

Hereinafter, a structure of the display module 100 provided by some embodiments of the present disclosure is schematically described with reference to the accompanying drawings.

In some embodiments, as shown in FIGS. 3 to 13, the display module 100 includes a display panel 1.

Figure 3:
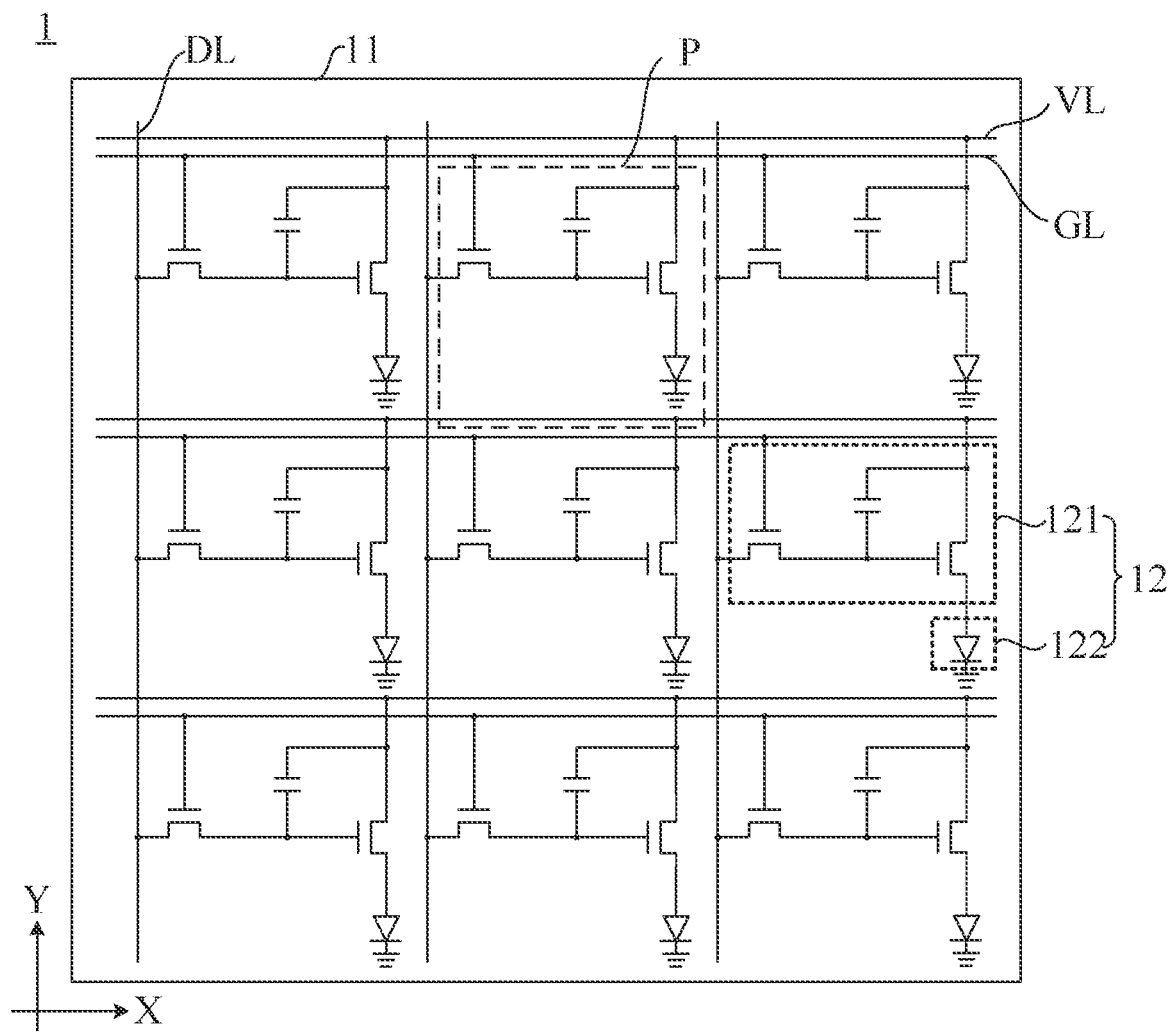
FIG. 3 is a structural diagram of a display panel, in accordance with some embodiments of the present disclosure.
Figure 5:
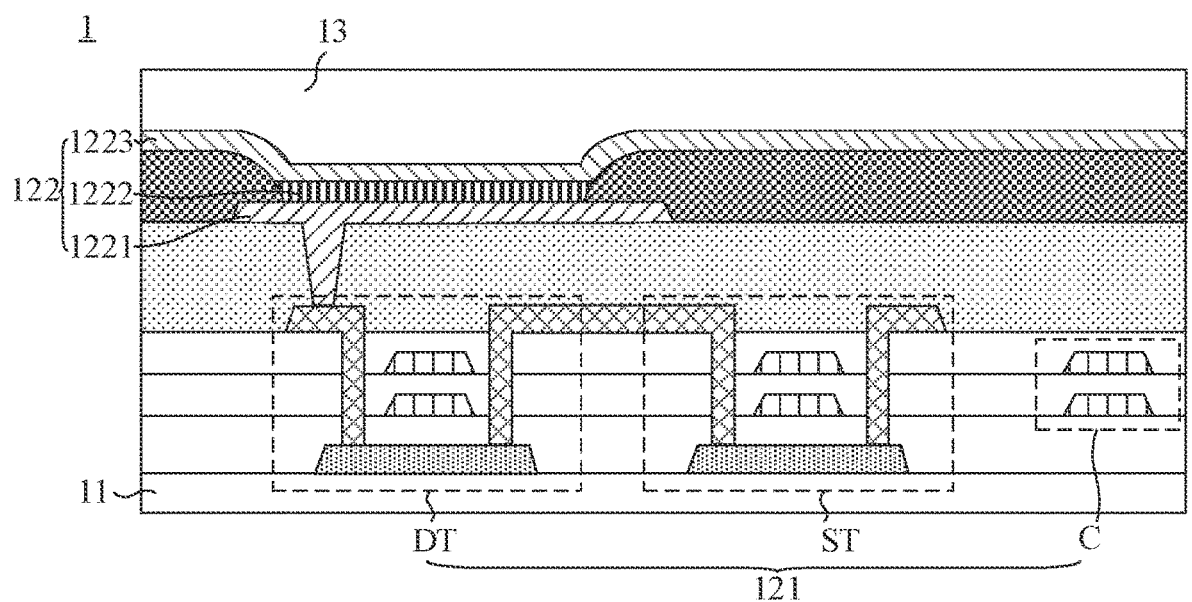
FIG. 5 is a structural diagram of yet another display panel, in accordance with some embodiments of the present disclosure.
Figure 6:
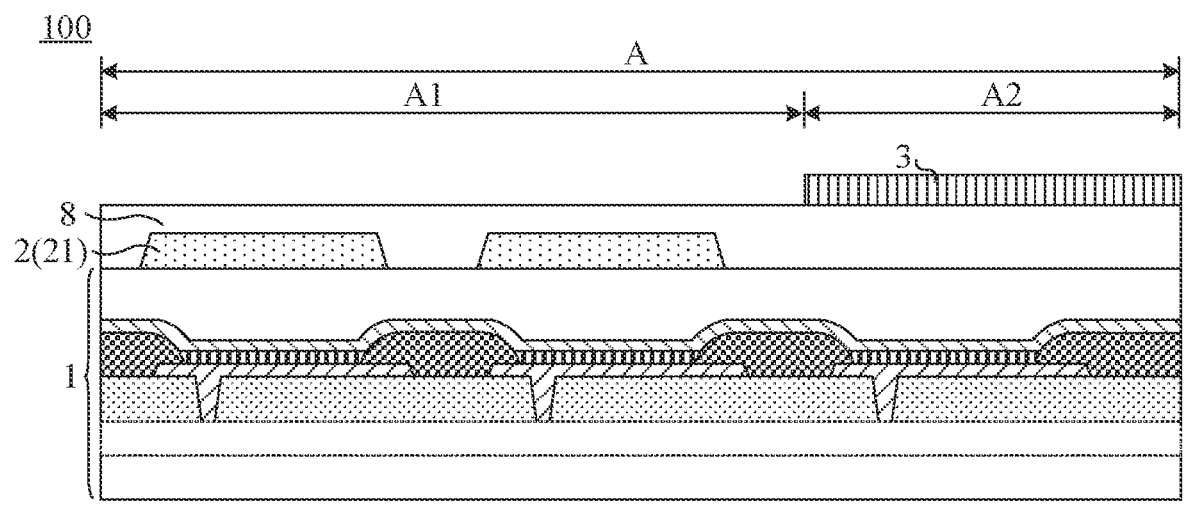
FIG. 6 is a structural diagram of yet another display module, in accordance with some embodiments of the present disclosure.
Figure 7:
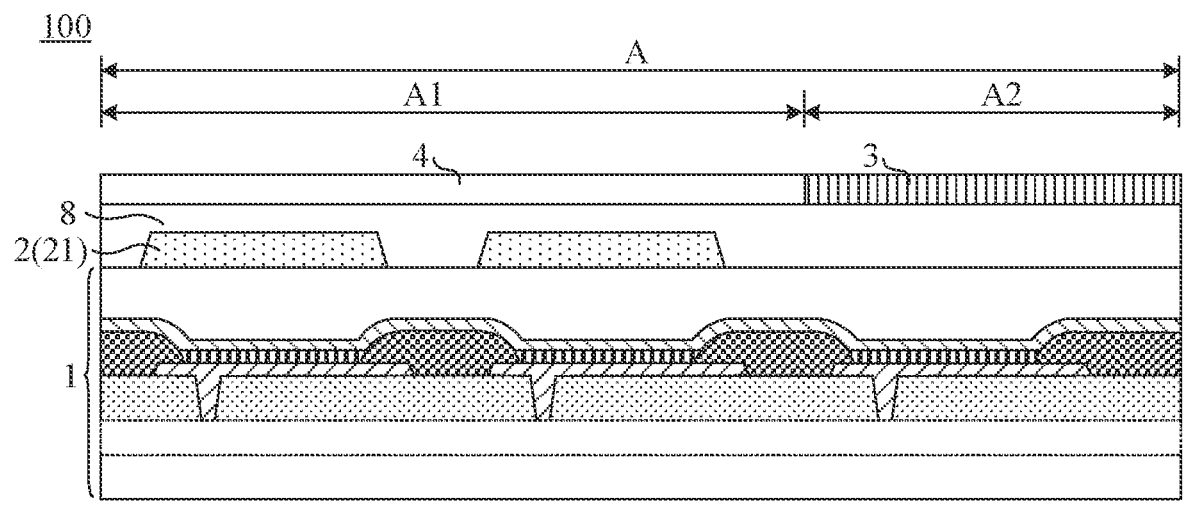
FIG. 7 is a structural diagram of yet another display module, in accordance with some embodiments of the present disclosure.
Figure 8:
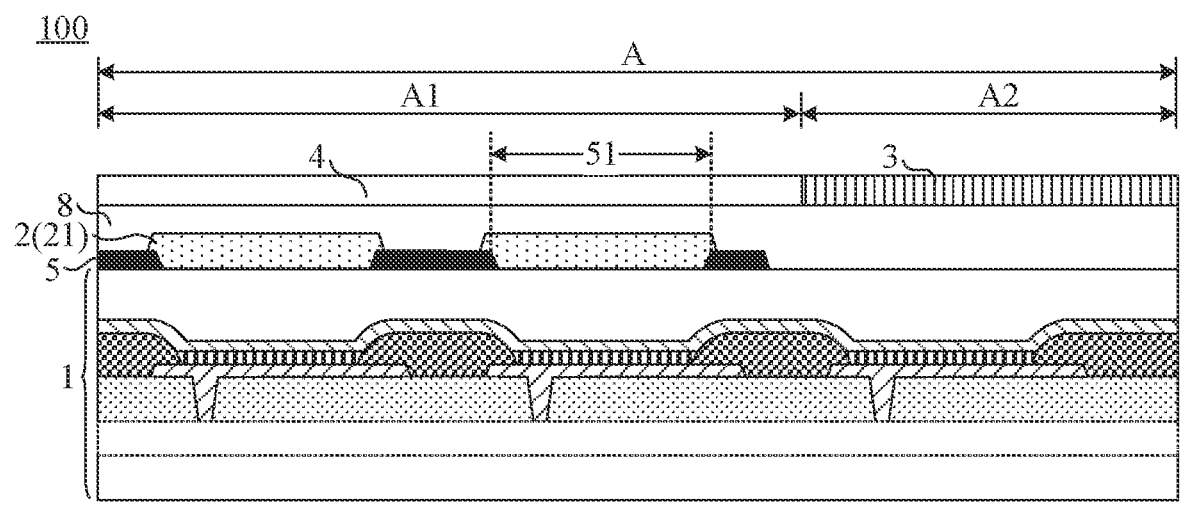
FIG. 8 is a structural diagram of yet another display module, in accordance with some embodiments of the present disclosure.
Figure 9:
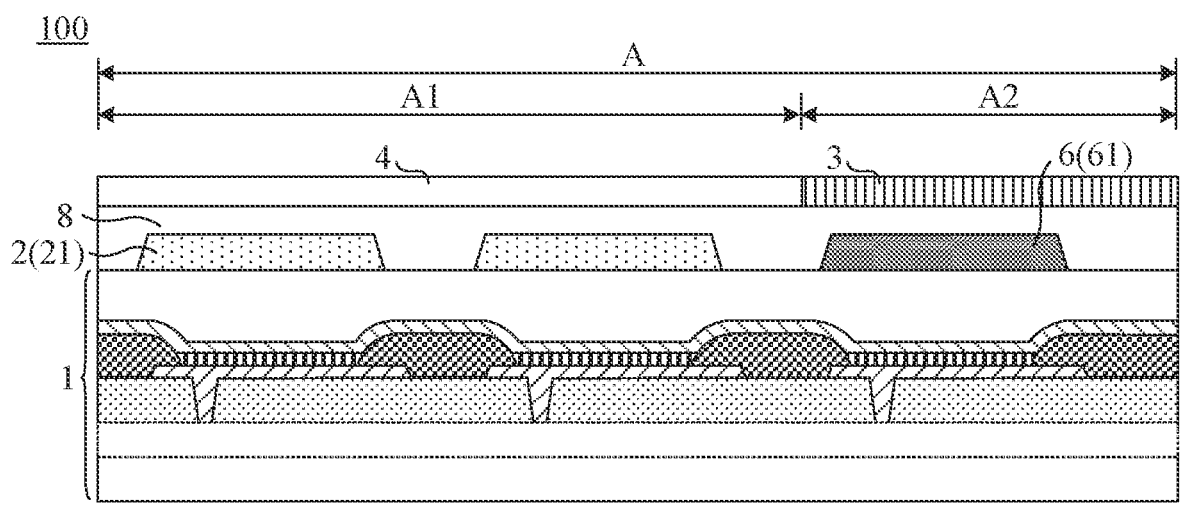
FIG. 9 is a structural diagram of yet another display module, in accordance with some embodiments of the present disclosure.
Figure 10:
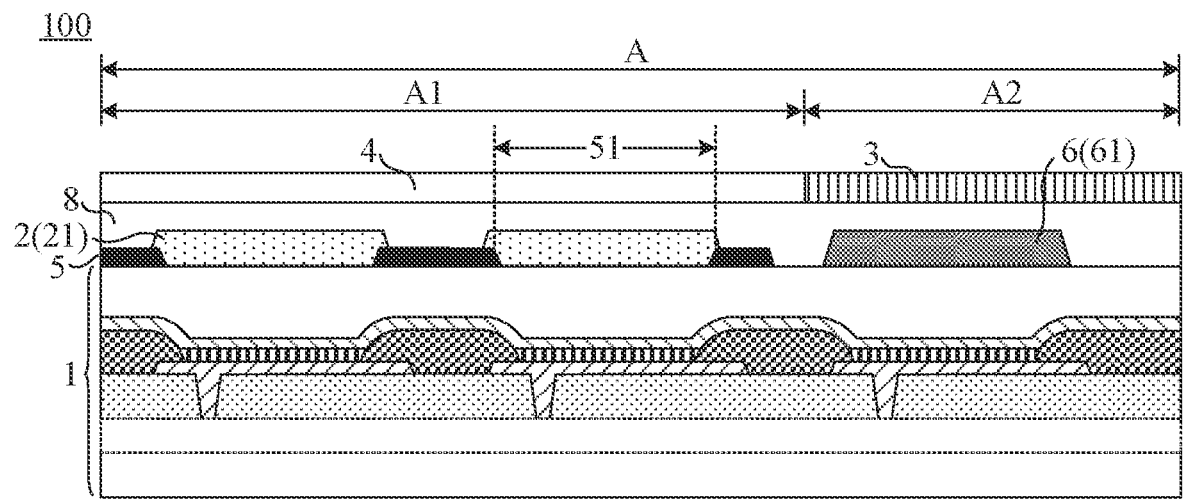
FIG. 10 is a structural diagram of yet another display module, in accordance with some embodiments of the present disclosure.

In some examples, as shown in FIGS. 3 and 5, the display panel 1 may include a base 11. It will be noted that, the base 11 is of a variety of types, which may be selected and set according to actual needs.

For example, the base 11 may be a rigid base. The rigid base may be a glass base or a polymethyl methacrylate (PMMA) base, etc.

For another example, the base 11 may be a flexible base. The flexible base may be a polyethylene terephthalate (PET) base, a polyethylene naphthalate (PEN) base or a polyimide (PI) base, etc.

In some examples, as shown in FIG. 3, the display panel 1 may further include a plurality of gate lines GL disposed at a side of the base 11 each extending in a first direction X, and a plurality of data lines DL disposed at a side of the base 11 each extending in a second direction Y. For example, the plurality of data lines DL are located at a side of the plurality of gate lines GL away from the base 11, and the plurality of data lines DL are insulated from the plurality of gate lines GL.

For example, as shown in FIG. 3, the plurality of gate lines GL intersect with the plurality of data lines DL to define a plurality of sub-pixel regions P. This means that the first direction X and the second direction Y intersect each other.

It will be noted that, an included angle between the first direction X and the second direction Y may be selected and set according to actual needs. For example, the included angle between the first direction X and the second direction Y is 90°; that is, the plurality of gate lines GL are perpendicular or approximately perpendicular to the plurality of data lines DL.

In some examples, as shown in FIG. 5, the display panel 1 may further include a plurality of sub-pixels 12 disposed at a side of the base 11.

For example, as shown in FIGS. 3 and 5, each sub-pixel 12 includes a pixel driving circuit 121 and a light-emitting device 122 electrically connected to the pixel driving circuit 121. The pixel driving circuit 121 is configured to provide a driving current to a light-emitting device 122 electrically connected thereto, so as to control a light-emitting state of the light-emitting device 122.

It will be noted that, an arrangement manner of the plurality of sub-pixels 12 is various, which may be selected and set according to actual needs.

Figure 4A:
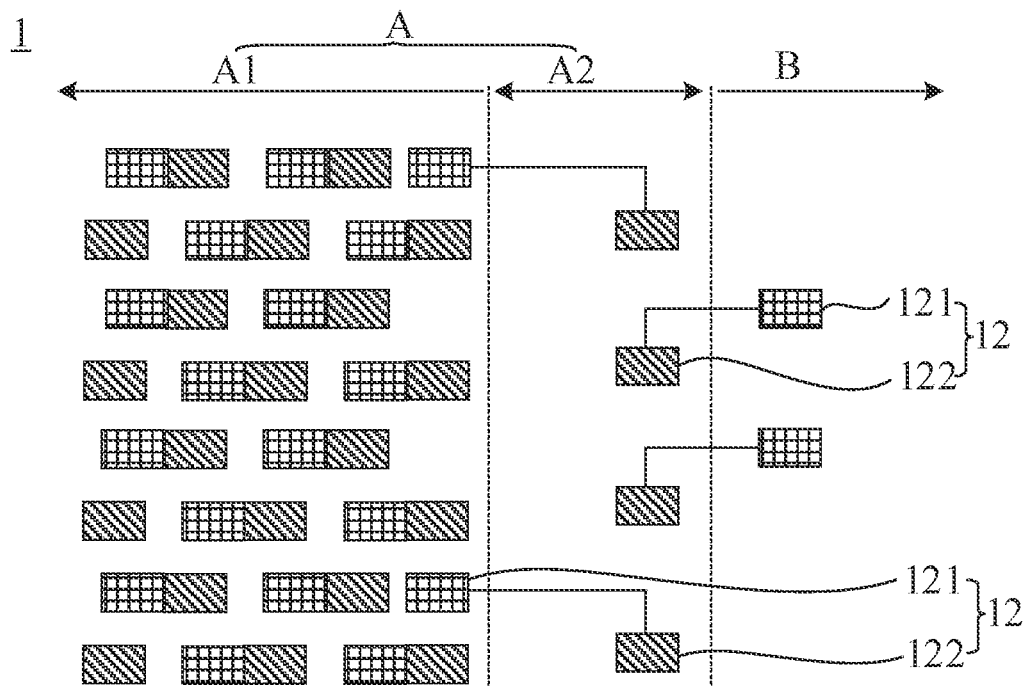
FIG. 4A is a structural diagram of another display panel, in accordance with some embodiments of the present disclosure.
Figure 4B:
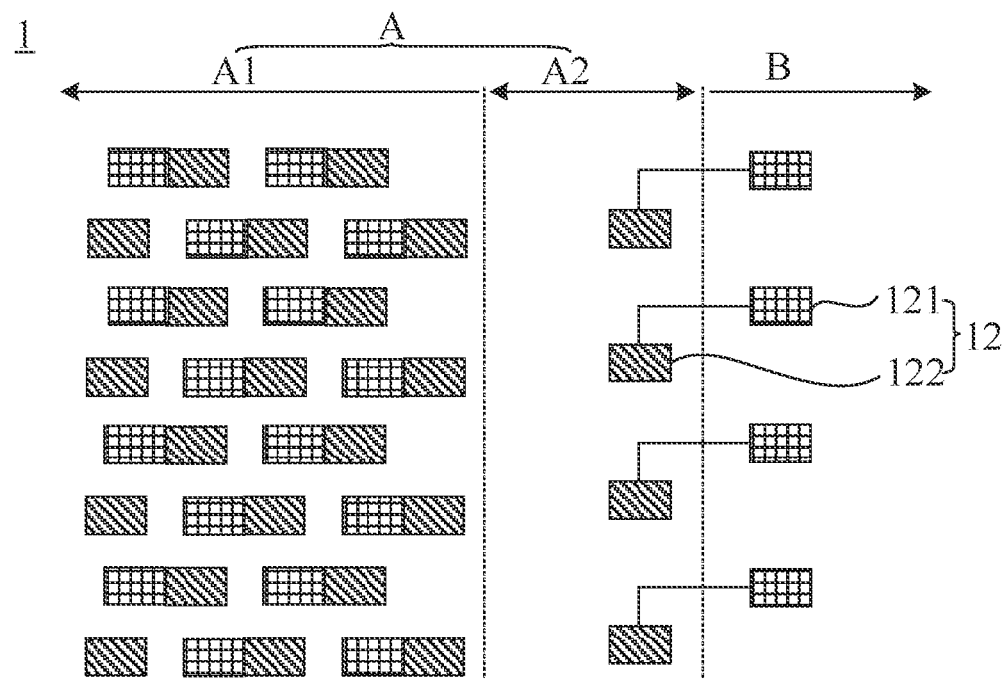
FIG. 4B is a structural diagram of yet another display panel, in accordance with some embodiments of the present disclosure.
Figure 4C:
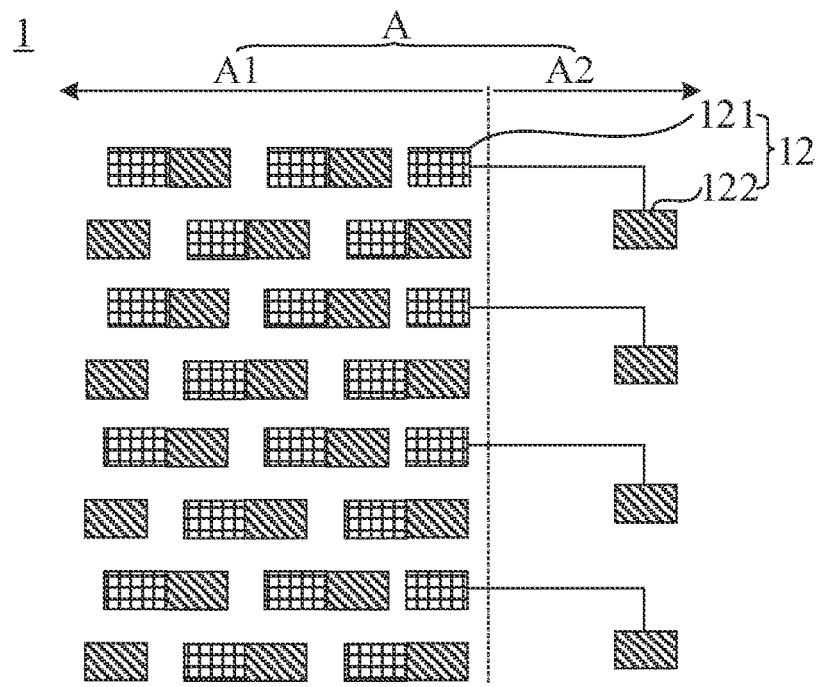
FIG. 4C is a structural diagram of yet another display panel, in accordance with some embodiments of the present disclosure.

In some examples, as shown in FIGS. 4A to 4C, some of the plurality of sub-pixels 12 are located in the main display area A1, that is, a light-emitting device 122 and a pixel driving circuit 121 electrically connected thereto in each of the some of the plurality of sub-pixels 12 are both located in the main display area A1; while light-emitting devices 122 in the other sub-pixels 12 are located in the sub display area A2, and pixel driving circuits 121 electrically connected to the light-emitting devices 122 are located in the main display area A1 or the peripheral area B.

It will be noted that, in a case where there are a plurality of light-emitting devices 122 located in the sub display area A2, since each of the plurality of light-emitting devices 122 is connected to a respective pixel driving circuit 121, there are also a plurality of pixel driving circuits 121 electrically connected to the plurality of light-emitting devices 122. In this case, the plurality of pixel driving circuits 121 may be located in the main display area A1 and/or the peripheral area B.

For example, as shown in FIG. 4A, some of the plurality of pixel driving circuits 121 are located in the main display area A1, and the other pixel driving circuits 121 are located in the peripheral area B.

For another example, as shown in FIG. 4B, the plurality of pixel driving circuits 121 are all located in the peripheral area B.

For yet another example, as shown in FIG. 4C, the plurality of pixel driving circuits 121 are all located in the main display area A1.

By arranging the non light-transmitting pixel driving circuits that are electrically connected to the light-emitting devices 122 located in the sub display area A2 to be located outside the sub display area A2 (e.g., located in the main display area A1 and/or the peripheral area B), some of arrangements in the above examples are beneficial to increase an area of a light-transmitting portion of a portion of the display module 100 located in the sub display area A2, so that more external light can pass through the portion of the display module 100 located in the sub display area A2 and then enter the optical device 200 below, thereby ensuring that the optical device 200 operates normally.

For example, the plurality of sub-pixels 12 may be disposed in the plurality of sub-pixel regions P, respectively. As shown in FIGS. 1 and 2, a distribution density of the sub-pixels 12 located in the main display area A1 may be, for example, greater than a distribution density of the sub-pixels 12 located in the sub display area A2.

In this way, shielding of the sub-pixels 12 in the sub display area A2 to the external light may be reduced, so that more light can pass through the portion of the display module 100 located in the sub display area A2 and then enter the optical device 200 below, thereby ensuring that the optical device 200 operates normally.

Hereinafter, the structure of the display module 100 is continued to be schematically described by considering an example in which the plurality of sub-pixels 12 may be disposed in the plurality of sub-pixel regions P, respectively.

For example, as shown in FIG. 3, sub-pixel regions P arranged in a line in the first direction X may be referred to as a same row of sub-pixel regions P, and sub-pixel regions P arranged in a line in the second direction Y may be referred to as a same column of sub-pixel regions P. Pixel driving circuits 121 in the same row of sub-pixel regions P may be electrically connected to one gate line GL, and pixel driving circuits 121 in the same column of sub-pixel regions P may be electrically connected to one data line DL. The gate line GL may provide a scan signal to a same row of pixel driving circuits 121 electrically connected thereto, and the data line DL may provide data signals to a same column of pixel driving circuits 121 electrically connected thereto.

For another example, pixel driving circuits 121 in the same row of sub-pixel regions P may also be electrically connected to a plurality of gate lines GL (e.g., two gate lines GL), which is not limited in the embodiments of the present disclosure.

In some examples, as shown in FIG. 3, the display panel 1 may further include a plurality of power supply lines VL disposed at a side of the base 11 each extending in the first direction X. The pixel driving circuits 121 in the same row of sub-pixel regions P may be electrically connected to one power supply line VL. The power supply line VL may provide a voltage signal to the same row of pixel driving circuits 121 electrically connected thereto.

It will be noted that, the pixel driving circuit 121 is of a variety of structures, which may be selected and set according to actual needs. For example, the pixel driving circuit 121 may be of a structure of "2T1C", "6T1C", "7T1C", "6T2C", or "7T2C". Here, "T" represents a transistor (e.g., thin film transistor), and the number before "T" represents the number of transistors. "C" represents a storage capacitor C, and the number before "C" represents the number of storage capacitors C.

For example, the plurality of thin film transistors included in the pixel driving circuit 121 of each structure include one driving transistor DT and one switching transistor ST.

Here, the switching transistor ST refers to a thin film transistor connected to the gate line GL and the data line DL among the plurality of thin film transistors included in the pixel driving circuit 121.

The driving transistor DT refers to a thin film transistor electrically connected to the switching transistor ST, the power supply line VL, and the light-emitting device 122 among the plurality of thin film transistors included in the pixel driving circuit 121.

For example, the driving transistor DT may be electrically connected with the power supply line VL directly (as shown in FIG. 3) or indirectly (i.e., through another conductive structure); moreover, the driving transistor DT may be electrically connected connected with the light-emitting device 122 directly (as shown in FIG. 3) or indirectly (i.e., through another conductive structure), and details may be selected and set according to the structure of the pixel driving circuit 121.

It will be noted that, the light-emitting device 122 is of a variety of structures, which may be selected and set according to actual needs.

For example, as shown in FIG. 5, the light-emitting device 122 includes an anode layer 1221 disposed at a side of the pixel driving circuit 121 away from the base 11 and electrically connected to the driving transistor DT in the pixel driving circuit 121, and a light-emitting layer 1222 and a cathode layer 1223 that are stacked sequentially and disposed at a side of the anode layer 1221 away from the base 11.

For example, the light-emitting device 122 may further include a hole injection layer and/or a hole transport layer disposed between the anode layer 1221 and the light-emitting layer 1222.

For example, the light-emitting device 122 may further include an electron transport layer and/or an electron injection layer disposed between the light-emitting layer 1222 and the cathode layer 1223.

It will be noted that the light-emitting layer 1222 is of a variety of structures. For example, the light-emitting layer 1222 may be an organic light-emitting layer. In this case, the light-emitting device 122 may be referred to as an OLED. For another example, the light-emitting layer 1222 may be an inorganic quantum dot light-emitting layer. In this case, the light-emitting device 122 may be referred to as a QLED.

For example, the light-emitting device 122 may be a top-emission type light-emitting device or a bottom-emission type light-emitting device. In an example where the light-emitting device 122 is the top-emission type light-emitting device, a material of the anode layer 1221 may be a metal material having a low light transmittance and high reflectivity.

It will be noted that, the plurality of light-emitting devices 122 in the plurality of sub-pixels 12 may emit light of multiple colors, and the light of the multiple colors cooperate with each other to achieve a display of images.

For example, the light of the multiple colors may include red light, green light, and blue light; or, the light of the multiple colors includes magenta light, yellow light, and cyan light.

In some examples, as shown in FIG. 5, the display panel 1 may further include an encapsulation layer 13 disposed at a side of the plurality of sub-pixels 12 away from the base 11. An orthogonal projection of each sub-pixel 12 on the base 11 is within a range of an orthogonal projection of the encapsulation layer 13 on the base 11. In this way, the encapsulation layer 13 may serve to form a good encapsulation effect on the sub-pixels 12 to prevent external water vapor and/or oxygen from corroding the light-emitting devices 122 in the sub-pixels 12 and affecting the luminous efficiency and service life of the light-emitting devices 122.

In order to avoid that the light emitted by adjacent sub-pixels 12 influence each other, there is a gap between adjacent sub-pixels 12; that is, there is a gap between anode layers 1221 of two adjacent light-emitting devices 122. In this way, the external light can pass through the gap between two adjacent anode layers 1221 from a light exit side (i.e., a light exit side of the display module 100) of the display panel 1, and then reach a non-light exit side (i.e., the non-light exit side of the display module 100) of the display panel 1.

In some embodiments, as shown in FIGS. 6 to 13, the display module 100 further includes a first color filter layer 2 disposed at the light exit side of the display panel 1 and located in the main display area A1.

It will be noted that the light exit side of the display panel 1 is related to a type of the light-emitting device 122. For example, in a case where the light-emitting device 122 is the top-emission type light-emitting device, the light exit side of the display panel 1 refers to a side of the encapsulation layer 13 away from the base 11; while in a case where the light-emitting device 122 is the bottom-emission type light-emitting device, the light exit side of the display panel 1 refers to a side of the base 11 away from the encapsulation layer 13. FIGS. 6 to 13 are schematically described by considering an example in which the light exit side of the display panel 1 refers to the side of the encapsulation layer 13 away from the base 11.

Moreover, It will be noted that, for convenience of description, in FIGS. 6 to 13, only a single dashed box serves to represent some insulating layers, and the pixel driving circuit 121 electrically connected to the light-emitting device 122, and detailed structures of these structures are not actually drawn.

In some examples, as shown in FIGS. 6 to 13, the first color filter layer 2 includes a plurality of first color filter portions 21. The plurality of first color filter portions 21 are of multiple colors.

For example, the plurality of light-emitting devices 122 can emit red light, green light, and blue light. In this case, the plurality of sub-pixels 12 in the display panel 1 include red sub-pixels, green sub-pixels, and blue sub-pixels accordingly.

For example, each sub-pixel 12 located in the main display area A1 corresponds to a respective first color filter portion 21 of a same color as the sub-pixel 12.

For example, a red sub-pixel located in the main display area A1 is arranged opposite to one red first filter portion, a green sub-pixel located in the main display area A1 is arranged opposite to one green first filter portion, and a blue sub-pixel located in the main display area A1 is arranged opposite to one blue first color filter portion.

In some of the above examples, by arranging the first color filter layer 2 at a light exit side of the main display area A1, the external light may be filtered by the first color filter layer 2 when entering a portion of the display module 100 located in the main display area A1, and only light of a single color corresponding to each first color filter portion 21 passes through the first color filter portion 21 and then enters the inside of the display panel 1. In addition, part of the filtered external light may be lost due to an action of an internal structure of the display panel 1, for example, due to a certain extent absorption of light by insulating layers such as the encapsulation layer 13. On this basis, after the filtered and lost external light is reflected by structures with high reflectivity inside the display panel 1, such as the anode layer 1221 of the light-emitting device 122 and/or the metal wires, the light will be filtered again by the first color filter layer 2 during a process in which it exits the display panel 1 from the first color filter layer 2. In this way, a reflection of the portion of the display module 100 located in the main display area A1 to the external light is effectively reduced.

In some embodiments, as shown in FIGS. 6 to 12, the display module 100 further includes a polarizing layer 3 disposed at the light exit side of the display panel 1 and located in the sub display area A2.

In some examples, a shape and a size of the polarizing layer 3 may be the same or approximately the same as a shape and a size of the sub display area A2.

In some examples, the polarizing layer 3 is configured to change a polarization direction of at least part of the external light entering the inside of the display panel 1, so as to prevent the at least part of the external light entering the inside of the display panel 1 from exiting from the light exit side of the display panel 1.

In some of the above examples, by providing the polarizing layer 3, when the external light enters the portion of the display module 100 located in the sub display area A2, the external light may be converted into left-hand (or right-hand) polarized light by the polarizing layer 3. That is, part of the external light having a direction parallel to a polarization direction of the polarizing layer 3 is retained, and the other part of the external light is absorbed. The left-hand (or right-hand) polarized light is reflected due to the action of the internal structure of the display panel 1, and is converted into the opposite right-hand (or left-hand) polarized light. Since a polarization direction of the right-hand (or left-hand) polarized light is perpendicular to the polarization direction of the polarizing layer 3, it cannot pass through the polarizing layer 3 and exit from the light exit side of the display module 100. In this way, a reflection of the portion of the display module 100 located in the sub display area A2 to the external light may be effectively reduced.

Therefore, in the display module 100 provided by some embodiments of the present disclosure, by providing the first color filter layer 2 and the polarizing layer 3 at the light exit side of the display panel 1, and arranging the first color filter layer 2 in the main display area A1 and the polarizing layer 3 in the sub display area A2, the first color filter layer 2 may serve to reduce the reflectivity of the portion of the display module 100 located in the main display area A1, and the polarizing layer 3 may serve to reduce the reflectivity of the portion of the display module 100 located in the sub display area A2. In this way, the reflectivity of the entire display module 100 to the external light may be effectively reduced, and the display effect of the display module 100 may be ensured.

Moreover, by setting the reflectivity of the first color filter layer 2 to the external light to be matched with (e.g., equal or approximately equal) the reflectivity of the polarizing layer 3 to the external light, it may be possible to make the reflectivity of the portion of the display module 100 located in the main display area A1 to the external light the same or approximately the same as the reflectivity of the portion of the display module 100 located in the sub display area A2 to the external light. Therefore, in a case where the display module 100 is in a dark state or the display module 100 is in an off-screen state, the reflectivity of the entire display module 100 is approximately the same, so as to ensure the display effect of the display module 100.

In addition, the area of the main display area A1 is greater than that of the sub display area A2. By providing the first color filter layer 2 in the main display area A1 with a large area and providing the polarizing layer 3 in the sub display area A2 with a small area, a light transmittance of the display module 100 may be effectively improved compared with the arrangement that the whole circular polarizer is integrally laid on the light exit side of the OLED display apparatus. In this way, in a same display brightness, a required current density of the display module 100 in the present disclosure is less than a required current density of the OLED display apparatus provided with the circular polarizer, a power consumption of the display module 100 may be effectively reduced, and the service life of the display module 100 may be increased.

It will be noted that, the beneficial effects that can be achieved by the display apparatus 1000, including the display module 100, provided in some embodiments of the present disclosure are the same as the beneficial effects that can be achieved by the display module 100 provided in some of the embodiments, which will not be repeated here.

In some embodiments, the display apparatus 1000 may be any product or component with a display function, such as a mobile phone, a tablet computer, a television, a display, a notebook computer, a digital photo frame, or a navigator.

Hereinafter, the structure of the display module 100 is continued to be schematically described in conjunction with the accompanying drawings.

In some embodiments, in a case where the display module 100 is in the dark state or the display module 100 is in the off-screen state, the reflectivity of the portion of the display module 100 located in the main display area A1 is within a range of about 5.5% to about 6%. That is, the reflectivity of the portion of the display module 100 located in the sub display area A2 may also be within the range of about 5.5% to about 6%.

For example, the reflectivity of the portion of the display module 100 located in the main display area A1 may be 5.5%, 5.7%, 5.9%, or 6%. Accordingly, the reflectivity of the portion of the display module 100 located in the sub display area A2 may be 5.5%, 5.6%, 5.8%, or 6%.

It will be noted that, in a process of setting the reflectivity of the first color filter layer 2 to the external light and the reflectivity of the polarizing layer 3 to the external light, for example, optical parameters (e.g., the hue or the light transmittance) of the polarizing layer 3 may be adjusted according to the reflectivity of the portion of the display module 100 located in the main display area A1, so that the reflectivity of the portion of the display module 100 located in the sub display area A2 is approximately the same as the reflectivity of the portion of the display module 100 located in the main display area A1.

Here, the polarizing layer 3 is of a variety of structures, which may be selected and set according to actual needs.

In some embodiments, the polarizing layer 3 may be a polarizer.

In some examples, as shown in FIGS. 7 to 13, the display module 100 further includes a light-transmitting sheet 4 disposed at the light exit side of the display panel 1 and located in the main display area A1. The light-transmitting sheet 4 is configured to transmit light.

For example, as shown in FIGS. 7 to 12, the light-transmitting sheet 4 is disposed at a side of the first color filter layer 2 away from the display panel 1, so as to facilitate subsequent manufacturing processes.

Figure 13:
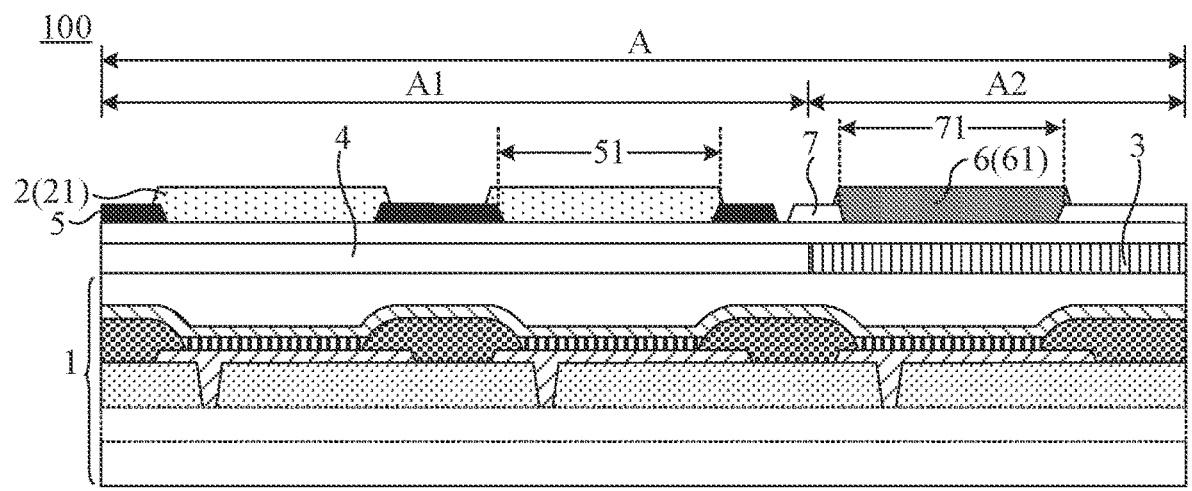
FIG. 13 is a structural diagram of yet another display module, in accordance with some embodiments of the present disclosure.

In some examples, as shown in FIG. 13, the light-transmitting sheet 4 is disposed at a side of the first color filter layer 2 proximate to the display panel 1.

For example, a shape and a size of the light-transmitting sheet 4 may be the same as or approximately the same as a shape and a size of the main display area A1.

In some examples, the light-transmitting sheet 4 and the polarizer may be an integral structure to form a partially faded polarizing structure. That is, the light-transmitting sheet 4 and the polarizer are a whole, and in a process in which the polarizer is formed in the sub display area A2, the light-transmitting sheet 4 is formed in the main display area A1 simultaneously.

It will be noted that, there is a partially faded region in the partially faded polarizing structure. A portion of the partially faded polarizing structure located in the partially faded region is the light-transmitting sheet 4 located in the main display area A1.

The light-transmitting sheet 4 has no polarizing function, and it is equivalent to a light-transmitting film with a certain light transmittance within a range of, for example, 45% to 90%. After the external light passes through the light-transmitting sheet 4, the polarization direction of the external light is basically unchanged. The other portion of the partially faded polarizing structure is the polarizer located in the sub display area A2, which has a polarizing function. After the external light enters the polarizer, only external light having a direction parallel to a polarization direction of the portion is allowed to pass through. That is, only part of the external light is allowed to pass through.

In some other embodiments, the polarizing layer 3 may be a polarizing film.

It will be noted that, a material of the polarizing film is various, and the material of the polarizing film may include, for example, at least one of an azo polymer material or a lyotropic liquid crystal material.

In some embodiments, as shown in FIGS. 8 and 10 to 13, the display module 100 further includes a black matrix 5 disposed between the display panel 1 and the first color filter layer 2 and located in the main display area A1. The black matrix 5 has a plurality of first openings 51, so that the black matrix 5 may have a grid shape.

For example, as shown in FIGS. 8 and 10 to 13, an orthogonal projection of the black matrix 5 on the base 11 does not overlap with orthogonal projections of the light-emitting devices 122 located in the main display area A1 on the base 11; or, a border of the orthogonal projection of the black matrix 5 on the base 11 overlaps with borders of the orthogonal projections of the light-emitting devices 122 located in the main display area A1 on the base 11.

For example, as shown in FIGS. 8 and 10 to 13, at least part of each first color filter portion 21 is located in a respective first opening 51. That is, part of each first color filter portion 21 may be located in a respective first opening 51, or the entire first color filter portion 21 may be located in the respective first opening 51, so that two adjacent first color filter portions 21 may be separated.

The black matrix 5 is made of a black light-absorbing material (e.g., carbon black-doped resin), which can absorb light. In some of the examples, by providing the black matrix 5, it may not only be possible to avoid a situation of color mixture of light exited from two adjacent sub-pixel regions P, but it may also be possible to absorb the external light using the black matrix 5. As a result, the reflectivity of the display module 100 to the external light is further reduced.

In some embodiments, as shown in FIGS. 9 to 13, the display module 100 further includes a second color filter layer 6 disposed at the light exit side of the display panel 1 and located in the sub display area A2.

In some examples, as shown in FIGS. 9 to 12, the polarizing layer 3 is disposed at a side of the second color filter layer 6 away from the display panel 1, so as to facilitate the subsequent manufacturing processes.

In some examples, as shown in FIG. 13, the polarizing layer 3 is disposed at a side of the second color filter layer 6 proximate to the display panel 1.

In some examples, as shown in FIGS. 9 to 13, the second color filter layer 6 includes a plurality of second color filter portions 61. The plurality of second color filter portions 61 are of multiple colors.

For example, each sub-pixel 12 located in the sub display area A2 corresponds to a respective second color filter portion 61 of a same color as the sub-pixel 12.

For example, a red sub-pixel located in the sub display area A2 is arranged opposite to one red second filter portion, a green sub-pixel located in the sub display area A2 is arranged opposite to one green second filter portion, and a blue sub-pixel located in the sub display area A2 is arranged opposite to one blue second color filter portion.

In some of the above examples, by providing the second color filter layer 6 in the sub display area A2, the second color filter layer 6 may cooperate with the polarizing layer 3 to jointly reduce the reflectivity of the portion of the display module 100 located in the sub display area A2 to the external light.

In addition, in a case where the second color filter layer 6 is disposed in the sub display area A2, while reducing the reflectivity of the polarizing layer 3 to the external light, the second color filter layer 6 may serve to increase a light transmittance of the portion of the display module 100 located in the sub display area A2. In this way, it is beneficial to reduce a required current density of the portion of the display module 100 located in the sub display area A2 when the portion displays an image, and the power consumption of the display module 100 may be further reduced, and the service life of the display module 100 may be improved.

In some embodiments, in the first color filter layer 2 and the second color filter layer 6, color filter portions of a same color have a same material and are disposed in a same layer.

For example, red first color filter portions and red second color filter portions may have a same material and be disposed in a same layer, green first color filter portions and green second color filter portions may have a same material and be disposed in a same layer, and blue first color filter portions and the blue second color filter portions may have a same material and be disposed in a same layer.

It will be noted that, the "same layer" mentioned herein refers to a layer structure formed by a film layer for forming specific patterns through a same film forming process and then through one patterning process using a same mask. Depending on the different specific patterns, one patterning process may include multiple exposure, development or etching processes, and the specific patterns in the formed layer structure may be continuous or discontinuous, and these specific patterns may also be at different heights or have different thicknesses. In this way, color filter portions of a same color in the first color filter layer 2 and the second color filter layer 5 may be formed simultaneously in one patterning process, which is beneficial to simplify the manufacturing process of the display module 100.

Figure 11:
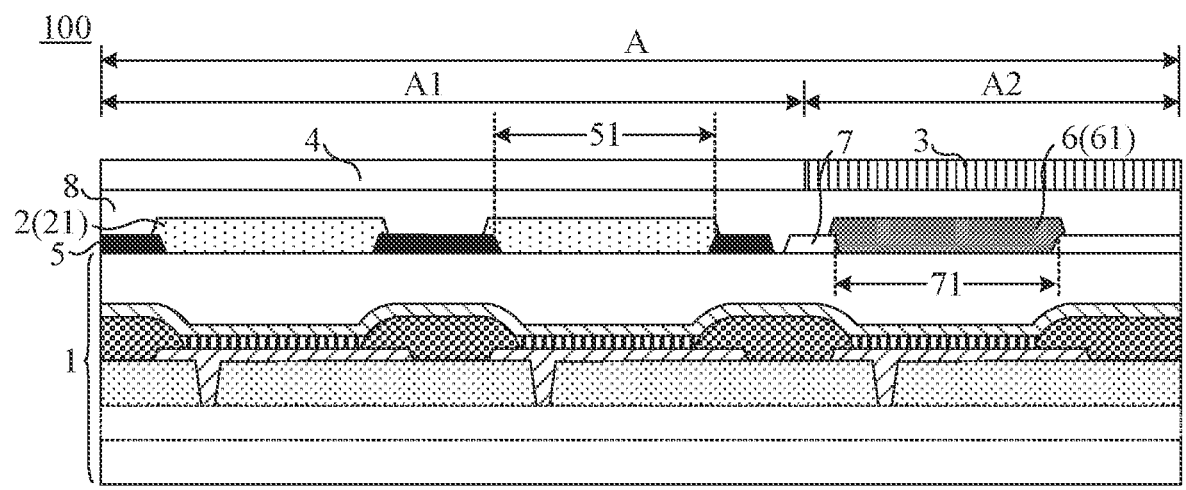
FIG. 11 is a structural diagram of yet another display module, in accordance with some embodiments of the present disclosure.
Figure 12:
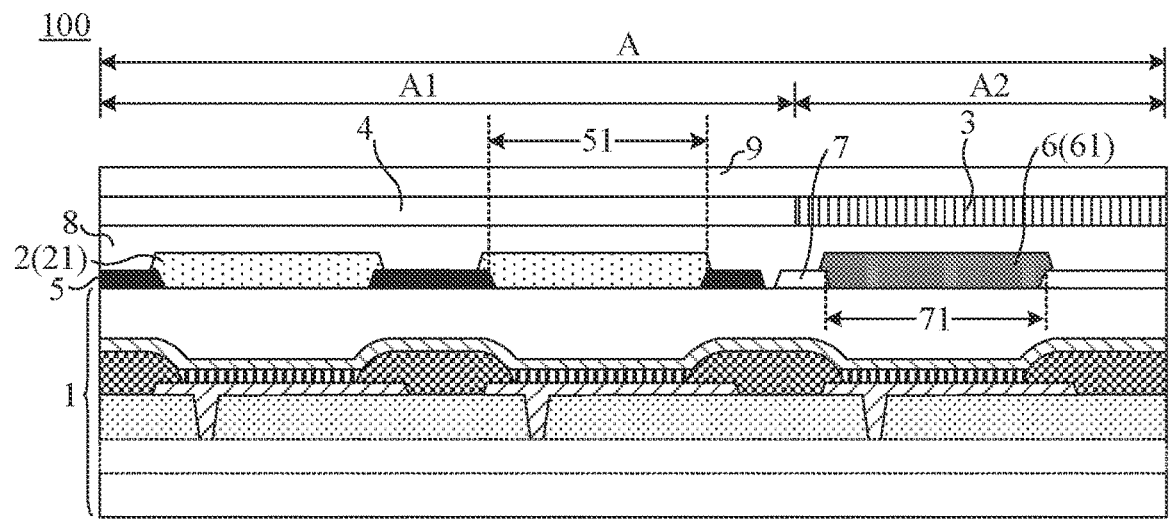
FIG. 12 is a structural diagram of yet another display module, in accordance with some embodiments of the present disclosure.

In some embodiments, as shown in FIGS. 11 to 13, the display module 100 further includes a light-transmitting layer 7 disposed between the display panel 1 and the second color filter layer 6 and located in the sub display area A2. The light-transmitting layer 7 has a plurality of second openings 71, so that the light-transmitting layer 7 may have a grid shape.

For example, as shown in FIGS. 11 to 13, an orthogonal projection of the light-transmitting layer 7 on the base 11 does not overlap with orthogonal projections of the light-emitting devices 122 located in the sub display area A2 on the base 11, or, a border of the orthogonal projection of the light-transmitting layer 7 on the base 11 overlaps with borders of the orthogonal projections of the light-emitting devices 122 located in the sub display area A2 on the base 11.

For example, as shown in FIGS. 11 to 13, at least part of each second color filter portion 61 is located in a respective second opening 71. That is, part of each second color filter portion 61 may be located in a respective second opening 71, or the entire second color filter portion 61 may be located in the respective second opening 71, so that two adjacent second color filter portions 61 may be separated.

The light-transmitting layer 7 has a relatively high light transmittance. In this way, during a process in which the optical device 200 disposed under the display panel 1 is operating, it may be possible to prevent the light-transmitting layer 7 from blocking the external light. Therefore, more external light can pass through the light-transmitting layer 7 and a gap between anode layers 1222 of two adjacent light-emitting devices 122, and then enter the optical device 200, and be collected by the optical device 200, which ensures a collection effect of the optical device 200 to the external light, and a normal operation of the optical device 200. Moreover, by providing the light-transmitting layer 7, a shape or a size of the second color filter portion 61 may be equal or approximately equal to a shape or a size of the first color filter portion 21, thereby making the reflectivity of the first color filter layer 2 and the reflectivity of the second color filter layer 6 to the external light consistent or tend to be consistent, and making a difficulty of adjusting the reflectivity of the polarizing layer 3 reduced.

In some examples, a material of the light-transmitting layer 7 includes a transparent organic material. The organic material may include, for example, an organic polymer material, and the organic polymer material may include, for example, an organic resin material.

In some examples, in a case where the display module 100 includes the black matrix 5 and the light-transmitting layer 7, dimensions of the two perpendicular to the base 11 may be equal or approximately equal, that is, thicknesses of the two may be equal or approximately equal.

In some embodiments, as shown in FIGS. 6 to 12, the display module 100 further includes a planarization layer 8 disposed at the light exit side of the display panel 1.

In some examples, as shown in FIGS. 6 to 12, the first color filter layer 2 is disposed at a side of the planarization layer 8 proximate to the display panel 1, and the polarizing layer 3 is disposed at a side of the planarization layer 8 away from the display panel 1.

For example, as shown in FIGS. 6 to 12, the planarization layer 8 covers the first color filter layer 2. In a case where the display module 100 further includes the second color filter layer 6, the second color filter layer 6 is also disposed at the side of the planarization layer 8 proximate to the display panel 1, that is, the planarization layer 8 also covers the second color filter layer 6.

In some of the examples, by providing the planarization layer 8 between the first color filter layer 2 and the polarizing layer 3, and/or providing the planarization layer 8 between the second color filter layer 6 and the polarizing layer 3, the planarization layer 8 may serve to protect the first color filter layer 2 and/or the second color filter layer 6, so as to avoid damage to the first color filter layer 2 and/or the second color filter layer 6 in the subsequent manufacturing processes. Moreover, after the planarization layer 8 covers the first color filter layer 2 and/or the second color filter layer 6, a surface of the planarization layer 8 away from the base 11 is still relatively flat due to that it has a relatively large thickness with respect to the first color filter layer 2 and/or the second color filter layer 6, which facilitates the subsequent arrangement of the polarizing layer 3.

The planarization layer 8 may be made of, for example, an organic material with a relatively high light transmittance.

In some embodiments, as shown in FIG. 12, the display module 100 further includes a cover plate 9 disposed at a side of the polarizing layer 3 away from the display panel 1.

In some examples, the cover plate 9 may be, for example, glass.

In some examples, as shown in FIG. 12, the light-transmitting sheet 4 is disposed between the first color filter layer 2 and the cover plate 9.

In some examples, as shown in FIG. 12, the polarizer (i.e., the polarizing layer 3) is disposed between the second color filter layer 6 and the cover plate 9.

In some of the above examples, in a case where the display module 100 includes the polarizer and the light-transmitting sheet 4 (i.e., the partially faded polarizing structure), since the partially faded polarizing structure has a certain strength, an anti-extrusion ability of the display module 100 may be improved and a problem that a rigidity of the cover plate 9 is insufficient due to the cover plate 9 being directly attached to the first color filter layer 2 may be avoided while the partially faded polarizing structure serves to reduce the reflectivity of the portion of the display module 100 located in the sub display area A2.

In some embodiments of the present disclosure, a method of manufacturing a display module is provided. As shown in FIG. 14, the manufacturing method includes step 100 (S100) to step 300 (S300).

In S100, a display panel 1 is provided. The display panel 1 has a display area A, and the display area A includes a main display area A1 and a sub display area A2.

In some examples, a structure of the display panel 1 may be referred to as the schematic descriptions in some of the above examples, which will not be repeated here.

In S200, a first color filter layer 2 is formed at a light exit side of the display panel 1. The first color filter layer 2 is located in the main display area A1, and the first color filter layer 2 includes a plurality of first color filter portions 21.

In some examples, the plurality of first color filter portions 21 are of multiple colors. In a process of forming the first color filter layer 2, a plurality of first color filter portions of one color may be manufactured first, and then first color filter portions of the remaining colors may be sequentially manufactured to obtain the first color filter layer 2.

Here, some of the process of forming the first color filter layer 2 is schematically described by considering an example in which red first color filter portions are manufactured.

For example, a material film of the red filter portions may be formed at the light exit side of the display panel 1, and then the red material film may be patterned through a photolithography process, so as to retain patterns located in the main display area A1 and opposite to red sub-pixels in the main display area A1. In this way, the plurality of red first color filter portions may be obtained.

In S300, a polarizing layer 3 is formed at the light exit side of the display panel 1. The polarizing layer 3 is located in the sub display area A2. The polarizing layer 3 is configured to change a polarization direction of at least part of external light entering the inside of the display panel 1, so as to prevent the at least part of the external light entering the inside of the display panel 1 from exiting from the light exit side of the display panel 1.

In some examples, in a case where the polarizing layer 3 is a polarizer, the polarizer may be disposed at the light exit side of the display panel 1 through an attaching process.

For example, the polarizer is disposed at a side of the first color filter layer 2 away from the display panel 1.

In some examples, in a case where the polarizing layer 3 is a polarizing film, a material of the polarizing film may be formed at the light exit side of the display panel 1 through a process such as coating, and then the polarizing film is formed by standing (in this case, the polarizing film may be made of a lyotropic liquid crystal material) or ultraviolet (UV) irradiation (in this case, the polarizing film may be made of an azo polymer liquid crystal material).

For example, the polarizing film is formed at the side of the first color filter layer 2 away from the display panel 1.

The method of manufacturing the display module provided by some embodiments of the present disclosure is used to manufacture the display module 100 in some of the above embodiments. The beneficial effects that can be achieved by the display module 100 are the same as the beneficial effects that can be achieved by the display module 100 provided in some of the above embodiments, which will not be repeated here.

In some embodiments, the polarizing layer 3 is a polarizer. As shown in FIG. 15, the method further includes: in S300, in a process of forming the polarizing layer 3, a light-transmitting sheet 4 is formed at the light exit side of the display panel 1 simultaneously. The light-transmitting sheet 4 is located in the main display area A1. The light-transmitting sheet 4 and the polarizer are an integral structure to form a partially faded polarizing structure.

It will be noted that, since the light-transmitting sheet 4 and the polarizer are an integral structure, when the polarizer is attached to the light exit side of the display panel 1, the light-transmitting sheet 4 may be attached to the light exit side of the display panel 1 simultaneously, so that the polarizer is located in the sub display area A2, and the light-transmitting sheet 4 is located in the main display area A1.

In some examples, as shown in FIG. 15, forming the partially faded polarizing structure may include: step 310 (S310) to step 320 (S320).

In S310, a polarizing structure to be processed is provided.

For example, the polarizing structure to be processed may be a whole circular polarizing film with a polarization function, and parameters of the polarizing film such as a polarization direction may be the same as those of the polarizer.

In S320, a portion of the polarizing structure to be processed located in the main display area A1 is faded to obtain the partially faded polarizing structure. A portion of the partially faded polarizing structure located in the main display area A1 forms the light-transmitting sheet 4 and a portion of the partially faded polarizing structure located in the sub display area A2 forms the polarizer.

For example, the polarizing structure to be processed is a whole iodine-contained polarizing film. In this case, the portion of the polarizing structure to be processed located in the main display area A1 is faded though immersion corrosion or high temperature treatment, so that the portion is faded and its polarization function is eliminated, and the polarization function of the remaining portion of the polarizing structure to be processed that has not been corroded or processed by high temperature is retained, so as to obtain the partially faded polarizing structure. The portion that has been faded forms the light-transmitting sheet 4 located in the main display area A1, and the portion that has not been faded forms the polarizer located in the sub display area A2.

For example, for the immersion corrosion treatment, a solution containing a reducing substance (e.g., ammonium ion) may be sprayed on a portion of the iodine-contained polarizing film to be converted into the light-transmitting sheet 4, or the portion of the iodine-contained polarizing film to be converted into the light-transmitting sheet 4 may be immersed in the aforementioned solution, so that dye molecules in the portion of the iodine-contained polarizing film may be faded to obtain the light-transmitting sheet 4 located in the main display area A1.

For another example, for the high temperature treatment, a portion of the iodine-contained polarizing film to be converted into the light-transmitting sheet 4 may be heated to about 85° C. and kept for at least 48 hours, so that dye molecules in the portion of the iodine-contained polarizing film may be faded to obtain the light-transmitting sheet 4 located in the main display area A1.

In some of the examples, the light-transmitting sheet 4 located in the main display area A1 and the polarizer located in the sub display area A2 are formed by fading the portion of the polarizing structure to be processed located in the main display area A1, so that the polarizer and the light-transmitting sheet 4 may be formed simultaneously in one patterning process, which is beneficial to simplify the manufacturing process of the display module 100.

The foregoing descriptions are merely specific implementation manners of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A display module having a display area, the display area including a main display area and a sub display area; the display module comprising:
    a display panel;
    a first color filter layer disposed at a light exit side of the display panel and located in the main display area, the first color filter layer including a plurality of first color filter portions;
    a second color filter layer disposed at the light exit side of the display panel and located in the sub display area, the second color filter layer including a plurality of second color filter portions; and
    a polarizing layer disposed at the light exit side of the display panel and located in the sub display area; wherein
    the polarizing layer is configured to change a polarization direction of at least part of external light entering an inside of the display panel, so as to prevent the at least part of the external light entering the inside of the display panel from exiting from the light exit side of the display panel.

2. The display module according to claim 1, wherein the polarizing layer is a polarizing film, and the polarizing film is made of at least one of an azo polymer material or a lyotropic liquid crystal material.

3. The display module according to claim 1, further comprising a black matrix disposed between the display panel and the first color filter layer and located in the main display area, the black matrix having:
    a plurality of first openings, wherein at least part of each first color filter portion is located in a respective one of the plurality of first openings.

4. The display module according to claim 1, wherein the polarizing layer is disposed at a side of the second color filter layer away from the display panel.

5. The display module according to claim 1, wherein the polarizing layer is disposed at a side of the second color filter layer proximate to the display panel.

6. The display module according to claim 1, wherein the plurality of first color filter portions are of different colors and the plurality of second color filter portions are of different colors; and
    first color filter portions and second color filter portions that are of a same color are made of a same material and disposed in a same layer.

7. The display module according to claim 1, further comprising a planarization layer disposed at the light exit side of the display panel; wherein
    the first color filter layer is disposed at a side of the planarization layer proximate to the display panel, and the polarizing layer is disposed at a side of the planarization layer away from the display panel.

8. A display apparatus, comprising:
    the display module according to claim 1; and
    an optical device disposed at a side of the display panel in the display module away from the polarizing layer and located in the sub display area of the display module.

9. The display module according to claim 1, further comprising a light-transmitting sheet disposed at the light exit side of the display panel and located in the main display area; wherein
    the polarizing layer is a polarizer, and the polarizer and the light-transmitting sheet are integrated with each other to form a partially faded polarizing structure.

10. The display module according to claim 9, wherein the light-transmitting sheet is disposed at a side of the first color filter layer away from the display panel.

11. The display module according to claim 1, further comprising a light-transmitting layer disposed between the display panel and the second color filter layer and located in the sub display area, the light-transmitting layer having:
    a plurality of second openings, wherein at least part of each second color filter portion is located in a respective one of the plurality of second openings.

12. The display module according to claim 11, wherein the light-transmitting layer is made of a transparent organic material.

13. The display module according to claim 1, wherein the plurality of first color filter portions are of different colors and the plurality of second color filter portions are of different colors; and
the display panel has a plurality of sub-pixels, wherein
each sub-pixel located in the main display area corresponds to a respective first color filter portion of a same color as the sub-pixel; and
each sub-pixel located in the sub display area corresponds to a respective second color filter portion of a same color as the sub-pixel.

14. The display module according to claim 13, wherein a distribution density of sub-pixels located in the main display area is greater than a distribution density of sub-pixels located in the sub display area.

15. The display module according to claim 13, wherein the display module further has a peripheral area located outside the display area;
each sub-pixel includes: a light-emitting device, and a pixel driving circuit electrically connected to the light-emitting device; wherein
a pixel driving circuit electrically connected to a light-emitting device located in the main display area is located in the main display area; and
a pixel driving circuit electrically connected to a light-emitting device located in the sub display area is located in the main display area or the peripheral area.

16. The display module according to claim 1, wherein in a case where the display module is in a dark state or an off-screen state, reflectivity of a portion of the display module located in the main display area is approximately the same as reflectivity of a portion of the display module located in the sub display area.

17. The display module according to claim 16, wherein in the case where the display module is in the dark state or the off-screen state, the reflectivity of the portion of the display module located in the main display area is within a range of about 5.5% to about 6%.

18. A method for manufacturing a display module, comprising:
providing a display panel; the display panel having a display area, the display area including a main display area and a sub display area;
forming a first color filter layer at a light exit side of the display panel; the first color filter layer being located in the main display area, and the first color filter layer including a plurality of first color filter portions; and
forming a polarizing layer at the light exit side of the display panel; the polarizing layer being located in the sub display area, and the polarizing layer being configured to change a polarization direction of at least part of external light entering an inside of the display panel, so as to prevent the at least part of the external light entering the inside of the display panel from exiting from the light exit side of the display panel; and
the method further comprising:
forming a second color filter layer at the light exit side of the display panel; the second color filter layer being located in the sub display area, and the second color filter layer including a plurality of second color filter portions.

19. The method according to claim 18, wherein the polarizing layer is a polarizer; the method further comprises:
forming a light-transmitting sheet at the light exit side of the display panel in a process in which the polarizing layer is formed; the light-transmitting sheet being located in the main display area, and the light-transmitting sheet and the polarizer being integrated with each other to form a partially faded polarizing structure; wherein
forming the partially faded polarizing structure includes:
providing a polarizing structure to be processed; and
fading a portion of the polarizing structure to be processed located in the main display area to obtain the partially faded polarizing structure; a portion of the partially faded polarizing structure located in the main display area forming the light-transmitting sheet, and a portion of the partially faded polarizing structure located in the sub display area forming the polarizer.

20. A display module having a display area, the display area including a main display area and a sub display area; the display module comprising:
a display panel;
a first color filter layer disposed at a light exit side of the display panel and located in the main display area, the first color filter layer including a plurality of first color filter portions;
a polarizing layer disposed at the light exit side of the display panel and located in the sub display area; wherein the polarizing layer is configured to change a polarization direction of at least part of external light entering an inside of the display panel, so as to prevent the at least part of the external light entering the inside of the display panel from exiting from the light exit side of the display panel; and
a black matrix disposed between the display panel and the first color filter layer and located in the main display area, the black matrix having a plurality of first openings, wherein at least part of each first color filter portion is located in a respective one of the plurality of first openings.

* * * * *